United States Patent [19]

Green

[11] 4,283,642

[45] Aug. 11, 1981

[54] REGULATION OF CURRENT THROUGH DEPLETION DEVICES IN A MOS INTEGRATED CIRCUIT

[75] Inventor: Robert S. Green, South Jordan, Utah

[73] Assignee: National Semiconductor Corporation, Santa Clara, Calif.

[21] Appl. No.: 74,015

[22] Filed: Sep. 10, 1979

[51] Int. Cl.³ ............................................. H03K 3/01

[52] U.S. Cl. .................................... 307/297; 307/304

[58] Field of Search ............................... 307/304, 297

[56] References Cited

U.S. PATENT DOCUMENTS

| | | | |
|---|---|---|---|
| T954,006 | 1/1977 | Lee et al. | 307/304 |
| 3,609,414 | 9/1971 | Pleshko | 307/304 |
| 4,100,437 | 7/1978 | Hoff | 307/304 |

*Primary Examiner*—Harold A. Dixon

*Attorney, Agent, or Firm*—Brown & Martin

[57] ABSTRACT

A substrate bias generator is controlled by a comparison circuit to regulate current through depletion devices in a MOS integrated circuit containing a plurality of given depletion devices having a given size and a given pinch-off voltage characteristic on a common substrate. The substrate bias generator is coupled to the substrate for pumping the substrate negatively to lower the effective pinch-off voltage of the given depletion devices, and thereby decrease the current through the given depletion devices. One of the given depletion devices has its source and gate connected to a first node. A reference device is connected to a second node for defining a reference voltage at the second node. The comparison circuit is connected to the first and second nodes for comparing the respective voltages at the first and second nodes and for providing a control signal when the voltage at the first node is not greater than the voltage at the second node. The comparison circuit is further coupled to the substrate bias generator for turning off the substrate bias generator while the control signal is provided. A resistance is connected to the first node in series with the given depletion device that is connected thereto for defining the level of current flow through the given depletion devices at which the substrate bias generator is turned off, to thereby regulate the current flow at such level.

10 Claims, 1 Drawing Figure

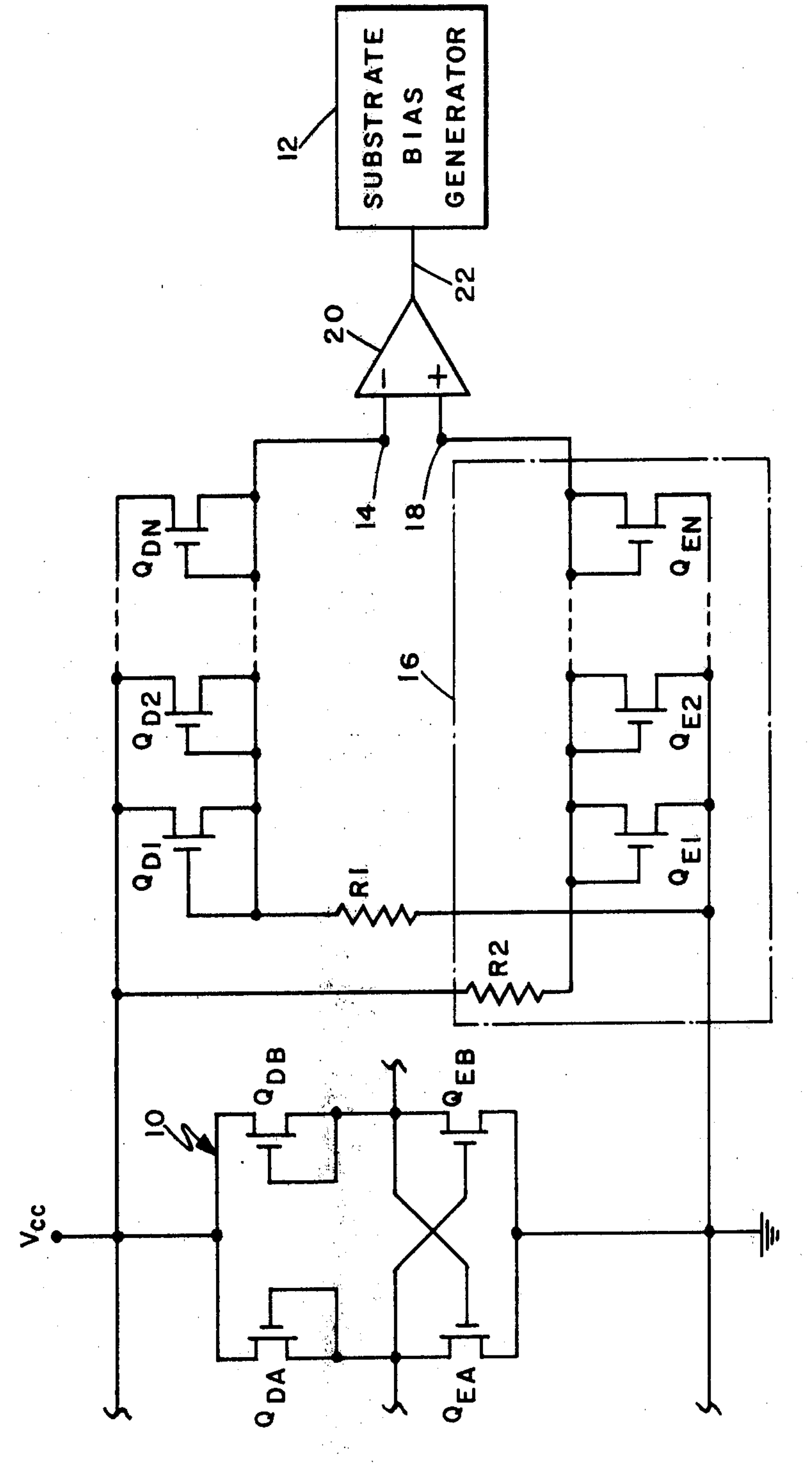
SUBSTRATE BIAS GENERATOR
12
22
20
14
18
16
QDN
QD2
QD1
QEN
QE2
QE1
R1
R2
QDB
QEB
QDA
QEA
10
Vcc

REGULATION OF CURRENT THROUGH DEPLETION DEVICES IN A MOS INTEGRATED CIRCUIT

BACKGROUND OF THE INVENTION

The present invention generally pertains to current regulation in integrated circuits and is particularly directed to the regulation of current through depletion devices in a MOS integrated circuit containing a plurality of depletion devices on a common substrate.

In designing a MOS integrated circuit to operate at a certain maximum amount of power and at a certain minimum frequency, the most important parameter is the depletion device current variation. The power that must be specified is directly proportional to the maximum current through the depletion devices.

Also, in certain circuit applications, depletion devices are required to conduct at least a minimum amount of current to enable conduction in circuit devices connected thereto. For example in an integrated circuit in which a pair of depletion devices are both series-coupled and cross-coupled to a pair of enhancement devices to define a cross-coupled latch, such as in an NMOS static RAM memory cell, the depletion devices must conduct at least a minimum amount of current to enable the enhancement device that is cross-coupled thereto to conduct the amount of current that is required for the storage of information. In such integrated circuits the depletion devices and enhancement devices are all fabricated on a common substrate; and the circuit contains both a plurality of given depletion devices having a given size and a given pinch-off voltage characteristic and a plurality of given enhancement devices having a given size and a given threshold voltage characteristic.

By regulating the current through the given depletion devices to provide only a tight current variation above the minimum current required, the power specification is reduced, which in turn enhances the speed/-power specification for the integrated circuit.

SUMMARY OF THE INVENTION

The present invention utilizes a substrate bias generator for regulating current flow through a plurality of given depletion devices having a given size and a given pinch-off voltage characteristic on a common substrate in a MOS integrated circuit, a substrate bias generator is coupled to the substrate for pumping the substrate negatively to lower the effective pinch-off voltage of the given depletion devices, and thereby decrease the current through the given depletion devices. One of the given depletion devices has its source and gate connected to a first node; and a reference device is connected to a second node for defining a reference voltage at the second node. A comparison circuit is connected to the first and second nodes for comparing the respective voltages at the first and second nodes and for providing a control signal when the voltage at the first node is not greater than the voltage at the second node. The comparison circuit is further coupled to the substrate bias generator for turning off the substrate bias generator while the control signal is provided. A resistance is connected to the first node in a series with the given depletion device that is connected thereto for defining the level of current flow through the given depletion devices at which the substrate bias generator is turned off, to thereby regulate the current flow at such level.

The present invention also is applicable to a PMOS integrated circuit, wherein the substrate bias generator is coupled to the substrate for pumping the substrate positively to raise the effective pinch-off voltage of the given depletion devices and thereby decrease the current through the given depletion devices. In other respects the current regulation system for a PMOS integrated circuit is the same as for the NMOS integrated circuit.

In an integrated circuit that further contains a plurality of given enhancement devices having a given size and a given threshold voltage characteristic on the common substrate, wherein a pair of the given enhancement devices are both series-coupled and cross-coupled to a pair of the given depletion devices to define a cross-coupled latch, the system of the present invention is characterized by the reference device including an additional one of the given enhancement devices having its drain and gate connected to the second node; and a second resistance connected to the second node in series with the additional given enhancement device that is connected thereto for defining the reference voltage at the second node, and for defining a level of current flow through the additional given enhancement device that is greater than the regulated level of current flow through the one given depletion device for assuring that a given enhancement device in the latch conducts whenever the depletion device that is cross-coupled thereto is rendered conductive.

Additional features of the present invention are discussed in the description of the preferred embodiments.

BRIEF DESCRIPTION OF THE DRAWING

The FIGURE of the drawing is a circuit diagram illustrating the current regulation system of the present invention in a MOS integrated circuit including a cross-coupled latch.

DESCRIPTION OF THE PREFERRED EMBODIMENT

Referring to the Drawing, a preferred embodiment of the current regulation system of the present invention is employed in an NMOS integrated circuit that contains a plurality of given depletion devices $Q_{DA}$, $Q_{DB}$, $Q_{D1}$, $Q_{D2}$, . . . $Q_{DN}$ having a given size and a given pinch-off voltage characteristic, and a plurality of given enhancement devices $Q_{EA}$, $Q_{EB}$, $Q_{E1}$, $Q_{EZ}$, $Q_{EN}$ having a given size and a given threshold voltage characteristic, all on a common substrate.

The integrated circuit includes a plurality of static RAM memory cells, that include cross coupled latches. For simplicity of illustration, only a cross-coupled latch 10 of one memory cell is shown in the Drawing. All of the cross-coupled latches 10 are constructed of the given enhancement devices and the given depletion devices on the common substrate. The cross-coupled latch 10 includes a pair of the given enhancement devices $Q_{EA}$, $Q_{EB}$, that are both series-coupled and cross-coupled to a pair of the given depletion devices $Q_{DA}$, $Q_{DB}$. The gate source made of the depletion device $Q_{DA}$ is connected to the gate of the cross-coupled enhancement device $Q_{EB}$, and the gate source made of the enhancement device $Q_{DB}$ is connected to the gate of the cross-coupled enhancement device $Q_{EA}$.

In the cross-coupled latch 10, the enhancement device on one side of the latch must conduct, when the enhancement device on the other side of the latch is not conducting in order for the latch to be useful for the storage of information. This is to say, while the enhancement device $Q_{EA}$ is conducting, the enhancement device $Q_{EB}$ is non-conducting, and vice versa. In order for either of the enhancement devices $Q_{EA}$ or $Q_{EB}$ to be rendered conductive, the current through the depletion device $Q_{DB}$ or $Q_{DA}$ that is cross-coupled thereto must be sufficient to pull the voltage at the gate source node of the depletion device to a voltage higher than the threshold voltage of the cross-coupled enhancement device.

The system of the present invention for regulating the current through the depletion devices $Q_{DA}$, $Q_{DB}$ includes a substrate bias generator 12 coupled to the substrate for pumping the substrate negatively to lower the effective pinch-off voltage of the given depletion devices, and thereby decrease the current through the given depletion devices; a first given depletion device $Q_{D1}$ having its source and gate connected in common to a first node 14; a reference device 16 connected to a second node 18 for defining a reference voltage at the second node 18; a comparison circuit 20 and a first resistance R1.

The comparison circuit 20 is connected to the first and second nodes 14, 18 for comparing the respective voltages at the first and second nodes and for providing a control signal on line 22 when the voltage at the first node is not greater than the voltage at the second node. The comparison circuit 22 is coupled to the substrate bias generator 12 via line 22 for turning off the substrate bias generator 12 while the control signal is provided on line 22. The first resistance R1 is connected to the first node 14 in series with the first given depletion device $Q_{D1}$ for defining the level of current flow through the given depletion devices $Q_{DA}$, $Q_{DB}$, $Q_{D1}$, . . . $Q_{DN}$ at which the substrate bias generator 12 is turned off, to thereby regulate the current flow at such level. The construction and theory of operation of substrate bias generators is set forth in U.S. Pat. No. 4,142,114 to the present inventor, and in a publication by Huffman, Seegers and Green, "Substrate Bias Generator Optimizes Military MOS Memories", Military Electronics/Countermeasures, September 1977, pp. 62–76 by reference thereto.

At zero volts on the substrate, the pinch-off voltage of a depletion device is at its most negative value, whereby the current flow through the depletion device is at a maximum. By pumping the substrate negatively, the pinch-off voltage of the depletion devices is lowered, which in turn decreases the current through the depletion devices and minimizes power consumption. When the substrate bias generator 12 is turned off, the substrate leaks and the voltage level of the substrate moves toward ground potential. This movement causes the voltage at node 14 to rise to a level which is greater than the voltage at node 18, whereupon the comparison circuit 20 switches to remove the control signal from line 22 and the substrate bias generator 12 resumes pumping the substrate negatively. In this manner, the current through the depletion devices is kept relatively constant. The current flow through the depletion device $Q_{D1}$ could be maintained at a constant level if the resistance R1 were constant and if the voltage at node 18 were maintained at a constant level by the reference device 16. However, if the resistance R1 is fabricated on the substrate it may vary in value from one integrated circuit to another. Also in the embodiment shown in the drawing it is necessary that the current flow through the depletion devices be regulated in relation to the threshold voltage of the depletion devices to assure that the enhancement devices $Q_{EA}$ and $Q_{EB}$ in the cross-coupled latch be rendered conductive for storing information.

In order to maintain a constant regulated current in the integrated circuit shown in the voltage on node 18 is made by function of the threshold voltage of the enhancement devices. Accordingly, the reference device includes an additional one of the given enhancement devices $Q_{E1}$ having its drain and gate connected in common to the second node 18; and a second resistance R2 connected to the second node 18 in series with the additional given enhancement device $Q_{E1}$ for defining the reference voltage at the second node and for defining a level of current flow through the additional given enhancement device $Q_{E1}$ that is greater than the regulated level of current flow through the one given depletion device $Q_{D1}$ for assuring that the given enhancement devices $Q_{EA}$, $Q_{EB}$ in the latch 10 conduct whenever the respective depletion device $Q_{DB}$, $Q_{DA}$ that is cross-coupled thereto is rendered conductive. Also the resistances R1 and R2 may be fabricated on the substrate without regard for variations in the absolute valves of these resistances between different integrated circuits on different substrates.

The threshold voltage of the enhancement devices is also regulated to a certain extent, in that the threshold voltage of the additional given enhancement device $Q_{E1}$ is raised in response to the substrate being pumped negatively. When the threshold voltage for a zero volts substrate bias is at a higher value, the substrate will not be pumped as far as when the threshold voltage for a zero volts substrate bias is lowered.

For MOS there are four primary types of devices having the following nominal values for threshold or pinch-off voltage.

| Device Type | Implant | Threshold/Pinch-off |
|---|---|---|
| Hard Enhancement | Boron | +0.8 v. |
| Soft Enhancement | None | +0.3 v. |
| Soft Depletion | Boron & Arsenic | −1.7 v. |
| Hard Depletion | Arsenic | −2.4 v. |

In view of the foregoing values, the enhancement device $Q_{E1}$ is a hard enhancement device, and the depletion device $Q_{D1}$ is a soft depletion device, and the device $Q_{E1}$ is at its zero volt substrate bias value, then the device $Q_{D1}$ will have a tendancy to be higher, which means that the bulk will be pumped more negatively, thereby correcting for both hard enhancement and soft depletion. The hard enhancement and soft depletion devices will also tend to track each other because of their common boron implant. For a higher threshold voltage of the hard enhancement device, node 18 will be higher so the substrate bias generator 12 will not have to pump the substrate as far to make nodes 14 and 18 equal. Therefore, the threshold voltage also will be compensated. Accordingly, it is preferable that the given depletion devices be soft depletion devices, and that the given enhancement devices be hard enhancement devices.

So that the resistances R1 and R2 need not be too large in size as to enable them to be fabricated on the substrate, a plurality of the given depletion devices $Q_{D2}$, . . . $Q_{DN}$ are connected in parallel with the first given depletion device $Q_{D1}$ between the first node 14 and a source of bias voltage $V_{cc}$; and a plurality of the given enhancement devices $Q_{E2}$, . . . $Q_{EN}$ are connected in parallel with the additional one of the given enhancement devices $Q_{E1}$ between the second node 18 and a source of bias voltage (circuit ground). The term common size as used herein, means common dimension.

I claim:

1. In an NMOS integrated circuit containing a plurality of given depletion devices having a given size and a given pinch-off voltage characteristic on a common substrate, a system for regulating current flow through the given depletion devices, comprising a substrate bias generator coupled to the substrate for pumping the substrate negatively to lower the effective pinch-off voltage of the given depletion devices, and thereby decrease the current through the given depletion devices;

one of the given depletion devices having its source and gate connected to a first node;

a reference device connected to a second node for defining a reference voltage at the second node;

a comparison circuit connected to the first and second nodes for comparing the respective voltages at the first and second nodes and for providing a control signal when the voltage at the first node is not greater than the voltage at the second node, wherein the comparison circuit is coupled to the substrate bias generator for turning off the substrate bias generator while the control signal is provided; and a resistance connected to the first node in series with the given depletion device that is connected thereto for defining the level of current flow through the given depletion devices at which the substrate bias generator is turned off, to thereby regulate said current flow at said level.

2. A system according to claim 1, in a said integrated circuit further containing a plurality of given enhancement devices having a given size and a given threshold voltage characteristic on the common substrate wherein a pair of said given enhancement devices are both series-coupled and cross-coupled to a pair of said given depletion devices to define a cross-coupled latch, the system being characterized by the reference device comprising an additional one of the given enhancement devices having its drain and gate connected to the second node; and a second resistance connected to the second node in series with the additional given enhancement device that is connected thereto for defining said reference voltage at the second node, and for defining a level of current flow through the additional given enhancement device that is greater than said regulated level of current flow through the one given depletion device for assuring that a said given device in said latch conducts whenever the depletion device that is cross-coupled thereto is rendered conductive.

3. A system according to claim 2, wherein a plurality of the given enhancement devices are connected in parallel with the additional one of the given enhancement devices between the second node and a source of bias voltage.

4. A system according to claim 1, 2 or 3, wherein a plurality of the given depletion devices are connected in parallel with the one given depletion device between the first node and a source of bias voltage.

5. A system according to claim 1, in a said integrated circuit characterized by the given depletion devices being soft depletion devices, and the given enhancement devices being hard enhancement devices.

6. In a PMOS integrated circuit containing a plurality of given depletion devices having a given size and a given pinch-off voltage characteristic on a common substrate, a system for regulating current flow through the given depletion devices, comprising a substrate bias generator coupled to the substrate for pumping the substrate positively to raise the effective pinch-off voltage of the given depletion devices, and thereby decrease the current through the given depletion devices;

one of the given depletion devices having its source and gate connected to a first node;

a reference device connected to a second node for defining a reference voltage at the second node;

a comparison circuit connected to the first and second nodes for comparing the respective voltages at the first and second nodes and for providing a control signal when the voltage at the first node is not greater than the voltage at the second node, wherein the comparison circuit is coupled to the substrate bias generator for turning off the substrate bias generator while the control signal is provided; and a resistance connected to the first node in series with the given depletion device that is connected thereto for defining the level of current flow through the given depletion devices at which the substrate bias generator is turned off, to thereby regulate said current flow at said level.

7. A system according to claim 6 in a said integrated circuit further containing a plurality of given enhancement devices having a given size and a given threshold voltage characteristic on the common substrate wherein a pair of said given enhancement devices are both series-coupled and cross-coupled to a pair of said given depletion devices to define a cross-coupled latch, the system being characterized by the reference device comprising an additional one of the given enhancement devices having its drain and gate connected to the second node; and a second resistance connected to the second node in series with the additional given enhancement device that is connected thereto for defining said reference voltage at the second node, and for defining a level of current flow through the additional given enhancement device that is greater than said regulated level of current flow through the one given depletion device for assuring that a said given enhancement device in said latch conducts whenever the depletion device that is cross-coupled thereto is rendered conductive.

8. A system according to claim 7, further comprising a plurality of the given enhancement devices connected in parallel with the additional one of the given enhancement devices between the second node and a source of bias voltage.

9. A system according to claim 6, 7 or 8, further comprising a plurality of the given depletion devices connected in parallel with the one given depletion device between the first node and a source of bias voltage.

10. A system according to claim 6, in a said integrated circuit characterized by the given depletion devices being soft depletion devices, and the enhancement devices being hard enhancement devices.

* * * * *